(12) United States Patent
Zeng et al.

(10) Patent No.: US 6,552,391 B2
(45) Date of Patent: Apr. 22, 2003

(54) LOW VOLTAGE DUAL-WELL TRENCH MOS DEVICE

(75) Inventors: Jun Zeng, Mountaintop, PA (US); Carl Franklin Wheatley, Jr., Drums, PA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 09/767,092

(22) Filed: Jan. 22, 2001

(65) Prior Publication Data

US 2002/0096714 A1 Jul. 25, 2002

(51) Int. Cl.$^7$ ............................................... H01L 29/72
(52) U.S. Cl. ........................ 257/342; 257/139; 257/311; 257/350; 257/351; 257/356
(58) Field of Search ................................. 257/342, 330, 257/331, 356, 311, 139

(56) References Cited

U.S. PATENT DOCUMENTS

| 4,941,026 A | | 7/1990 | Temple |
| 4,975,751 A | | 12/1990 | Beasom |
| 5,091,336 A | | 2/1992 | Beasom |
| 5,744,386 A | * | 4/1998 | Kenney ..................... 257/342 |
| 6,040,599 A | * | 3/2000 | Takahashi ................... 257/330 |
| 6,137,139 A | | 10/2000 | Zeng et al. |

FOREIGN PATENT DOCUMENTS

| EP | 9 720 235 | 7/1996 |
| WO | WO 97 07547 | 2/1997 |
| WO | WO 98 04004 | 1/1998 |

OTHER PUBLICATIONS

International Search Report in PCT/US02/01718, dated Dec. 12, 2002. ISA: European Patent Office.

* cited by examiner

*Primary Examiner*—Edward Wojciechowicz
(74) *Attorney, Agent, or Firm*—Thomas R. FitzGerald, Esq.

(57) ABSTRACT

An improved low-voltage MOS device having high ruggedness, low on-resistance, and improved body diode reverse recovery characteristics comprises a semiconductor substrate on which is disposed a doped upper layer of a first conduction type. The upper layer includes a doped first well region of the first conduction type and a doped well region of the second conduction type underlying the first well region. The upper layer further includes at its upper surface a heavily doped source region of the first conduction type and a heavily doped body region of a second and opposite conduction type. A trench gate comprising a conductive material separated from the upper layer by an insulating layer is disposed in the upper layer of the substrate.

24 Claims, 6 Drawing Sheets

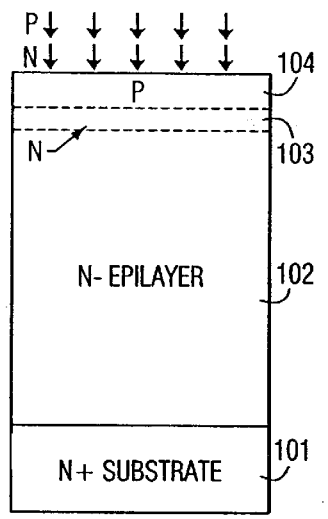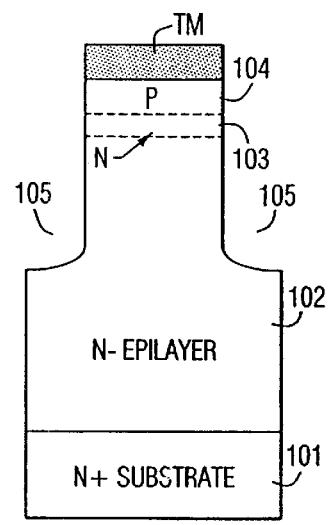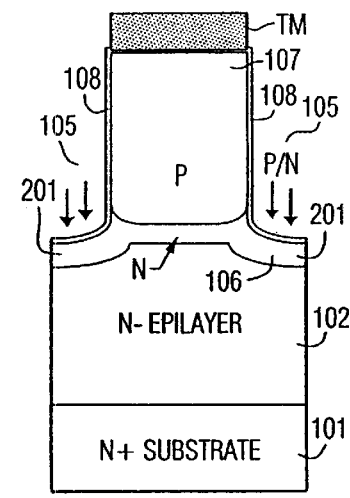
*FIG. 4A*  *FIG. 4B*  *FIG. 4C*
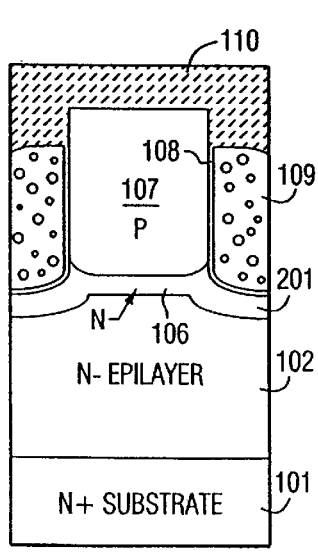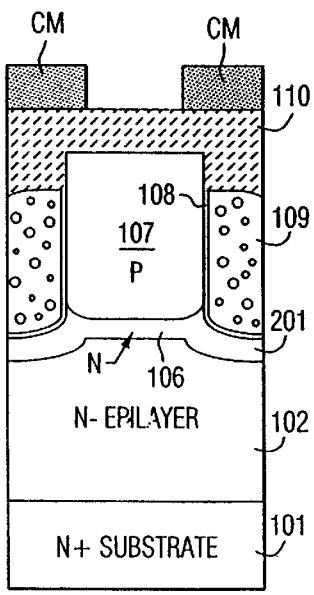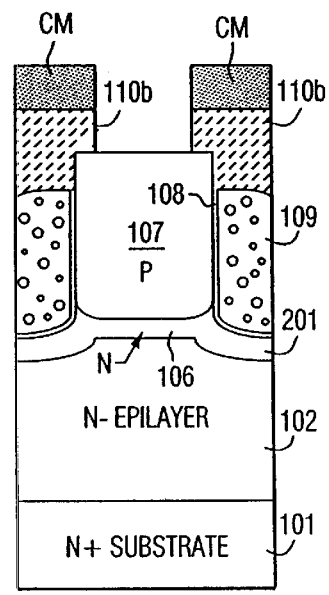
*FIG. 4D*  *FIG. 4E*  *FIG. 4F*

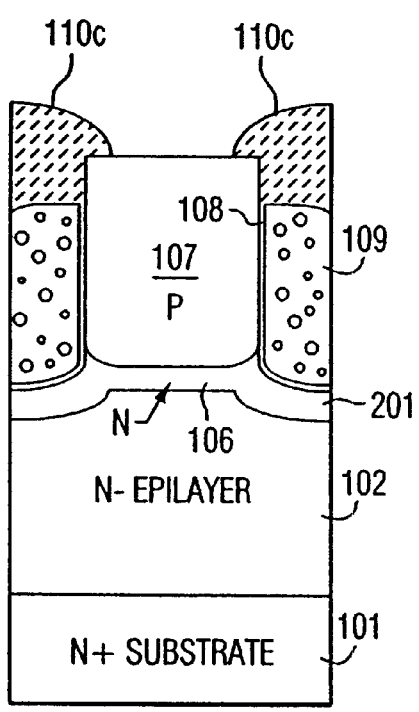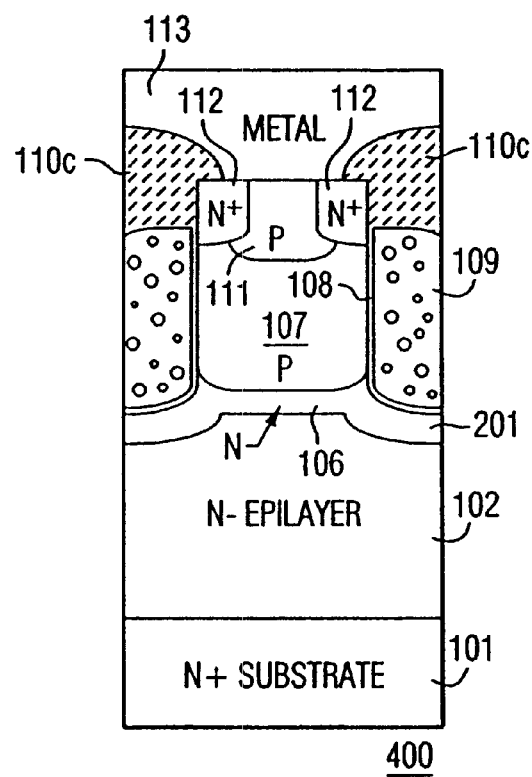
FIG. 4G
FIG. 4H

LOW VOLTAGE DUAL-WELL TRENCH MOS DEVICE

FIELD OF THE INVENTION

The present invention relates to MOS devices and, more particularly, to a rugged and reliable low voltage dual-well trench MOS device having low on-resistance and improved body diode reverse recovery characteristics.

BACKGROUND OF THE INVENTION

U.S. Pat. Nos. 4,975,751 and 5,091,336, the disclosures of which are incorporated herein by reference, describe high voltage component devices with low series resistance. However the recent proliferation of battery-powered, portable communication electronics has increased the need for low voltage, low on-resistance power MOSFETs for efficient power management. Furthermore, because such devices are frequently used in applications that involve inductive loads, it is desirable that they have high UIS (Unclamped Inductive Switching) capability. This is an extremely high stress process, during which the amount of avalanche energy absorbed by the device is expected to be as high as possible without resulting in catastrophic device failure. This capability is generally referred to as the device ruggedness. In addition, some applications such as synchronous rectifiers require that the body diode of a power MOSFET have a low reverse recovery charge and soft reverese recovery characteristics.

U.S. Pat. No. 6,137,139, the disclosure of which is incorporated herein by reference, describes a low voltage dual-well MOS device that is rugged and reliable, exhibits low on-resistance, and exhibits improved body diode reverse recovery characteristics.

Unfortunately, items of concern such as device breakdown rating, on-resistance, improved UIS capability, and desirable body diode characteristics are often in conflict with one another. Thus, there is an ongoing need for improved MOS devices that exhibit an optimum combination of these characteristics, a need that is met by the present invention.

SUMMARY OF THE INVENTION

The present invention is directed to a rugged, reliable, low-voltage dual-well trench MOS device having low on-resistance, and improved body diode reverse recovery characteristics, and comprising a semiconductor substrate on which is disposed a lightly doped upper layer of a first conduction type. The upper layer includes a doped first well region of the first conduction type and a doped well region of the second conduction type underlying the first well region. The upper layer further includes at its upper surface a heavily doped source region of the first conduction type and a heavily doped body region of a second and opposite conduction type. A trench gate comprising a conductive material separated from the upper layer by an insulating layer is disposed in the upper layer of the substrate.

BRIEF DESCRIPTION OF THE DRAWINGS

FIGS. 4A–4H depict the steps in the formation of device 400, a fourth embodiment of the present invention.

DETAILED DESCRIPTION OF THE INVENTION

The low-voltage dual-well trench MOS device of the present invention is formed using a semiconductor substrate having a lightly doped upper layer of a first conduction type A doped first well region of the first conduction type and a doped second well region of a second and opposite conduction type are formed by diffusing dopants of first and second conduction types into the upper surface of the upper layer, and a trench gate comprising a conductive material and an insulating layer is formed in the upper layer. A heavily doped source region of the first conduction type and a heavily doped body region of the second conduction type are formed in the second well region at the upper surface of the upper layer.

Figure 1A:
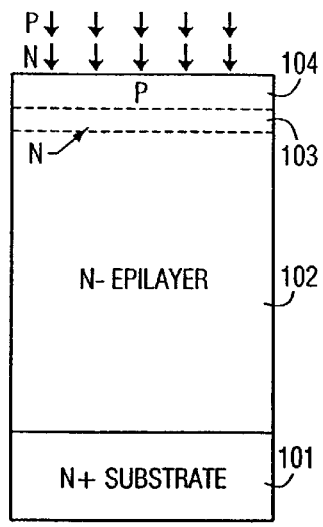
FIGS. 1A–1F depict the steps in the formation of device 100, a first embodiment of the present invention.
Figure 1B:
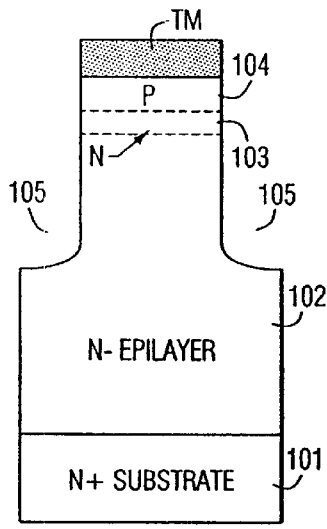

The formation of a low voltage MOS device 100 of the present invention is formed by the process represented by FIGS. 1A–1F. As shown in FIG. 1A, an N-type semiconductor substrate 101 such as monocrystalline silicon having a lightly doped N-type upper layer 102, which can be an epitaxial layer, is blanket implanted with an N-type dopant 103 such as phosphorus, and then with a P-dopant 104 such as boron. Using a trench mask TM, gate trenches 105 are etched into upper layer 102, as shown in FIG. 1B.

Figure 1C:
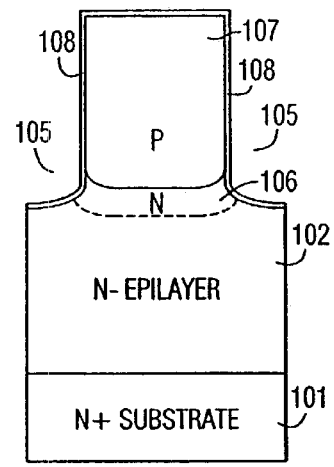
Figure 1D:
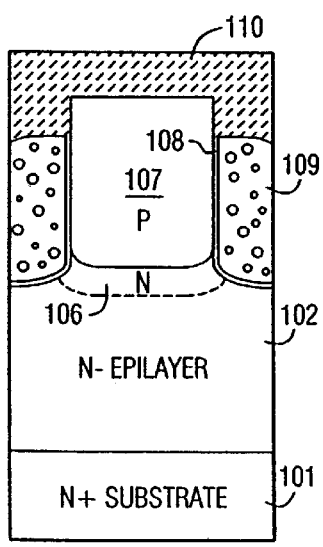

Dopants 103 and 104 are thermally driven into upper layer 102 to form, respectively, N-well 106 and P-well 107, and a lining of gate oxide 108 is formed in trenches 105, as depicted in FIG. 1C. Deposition and etching back of doped polysilicon results in the formation of a recessed gate conductor 109 in lined trenches 105, and an insulating layer 110 of BPSG, for example, is deposited over the gate and well regions, as shown in FIG. 1D.

Figure 1E:
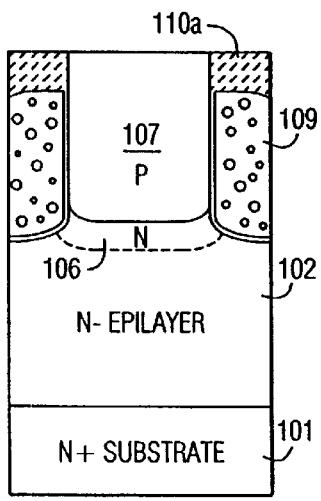
Figure 1F:
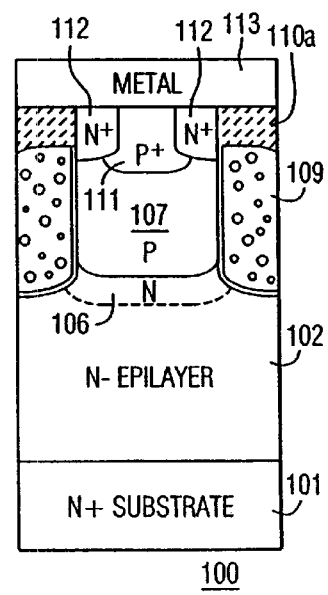

Following planarization of BPSG layer 110 to layer 110a, as shown in FIG. 1E, heavily doped P+ body and N+ source regions 111 and 112, respectively, are formed in P-well 107, and metal layer 113 is deposited to complete the formation of MOS device 100, depicted in FIG. 1F.

The inclusion of N-well 106 in MOS device 100 has the beneficial effect of an increase in forward current spreading angle and efficiency because of the lower resistive path conforming to the N-well/P-well junction. In addition, the N-well modifies the electric field profile and carrier distribution within upper layer 102 during body diode reverse recovery. Also, soft reverse recovery characteristics are achieved without increasing total reverse recovery charge. The dual N-well/P-well combination can thus produce substantially lowered on-resistance without degrading device ruggedness and reliability.

In an illustrative procedure for fabricating a power MOSFET of the present invention, phosphorus at a dosage of about $1\times10^{13}$ cm$^{-2}$ to about $5\times10^{14}$ cm$^{-2}$ and boron at a dosage of about $2\times10^{13}$ cm$^{-2}$ to about $8\times10^{14}$ cm$^{-2}$ are blanket implanted at about 40 KeV to about 120 KeV into the substrate. A gate trench is formed in the substrate, and the N-type and P-type dopants are driven into the substrate for about 90 minutes at a temperature of about 1100° C. to form self-aligned N- and P-wells. It is to be recognized that the conduction types of the blanket, well, body, source, and substrate dopants can each be reversed, N for P and P for N.

Figure 2A:
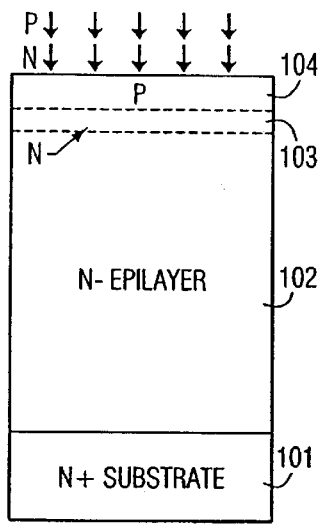
FIGS. 2A–2F depict the steps in the formation of device 200, a second embodiment of the present invention.
Figure 2B:
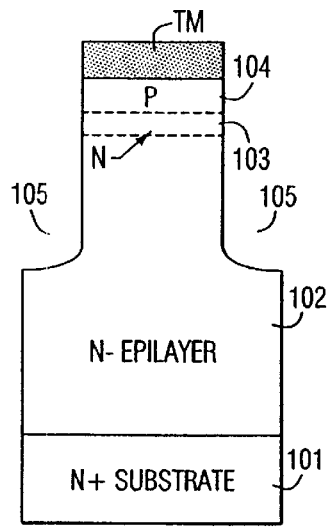
Figure 2C:
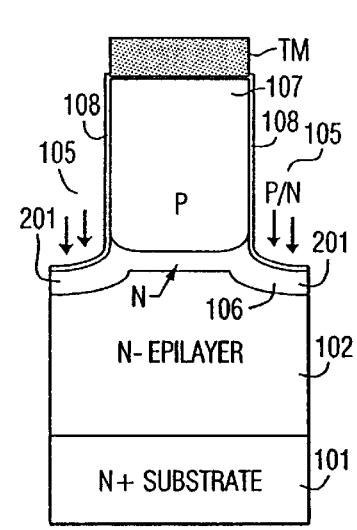

FIGS. 2A–2F schematically illustrate the formation of low voltage MOS device 200, a second embodiment of the present invention. The steps shown in FIGS. 2A and 2B are the same as those of FIGS. 1A and 1B for the formation of device 100. As depicted in FIG. 2C, following the driving of dopants 103 and 104 into upper layer 102 to form N-well 106 and P-well 107, and prior to formation of the gate oxide lining 108 in trenches 105, an N-type dopant, phosphorus/arsenic, for example, is implanted through the floor of trenches 105 to form a highly doped JFET, or neck region 201, that merges with N-well 106. This implant results in decreased resistance in JFET region 201.

Figure 2D:
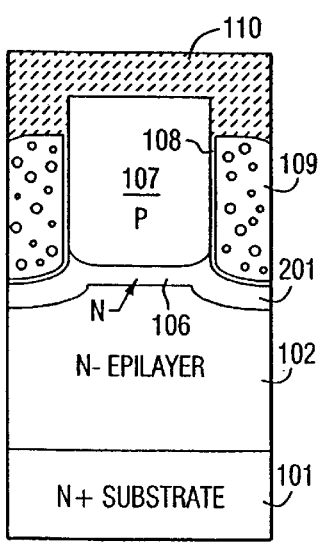
Figure 2E:
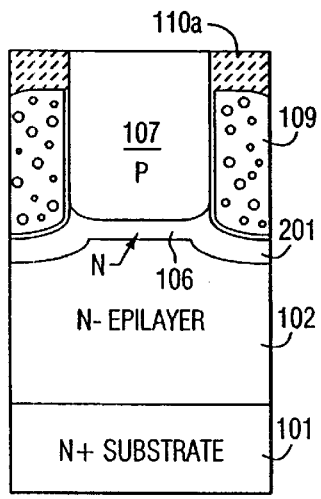
Figure 2F:
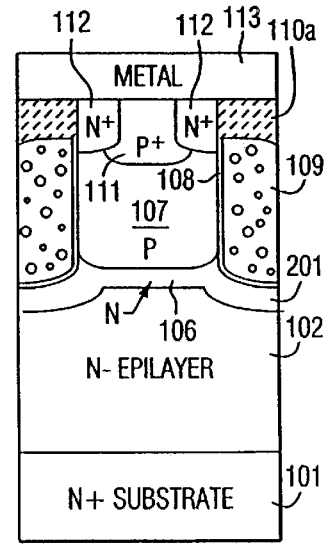

The resulting steps illustrated in FIGS. 2D–2F, resulting in the formation of MOS device 200, are substantially the same as those shown in FIGS. 1D–1F for the formation of device 100.

Figure 3A:
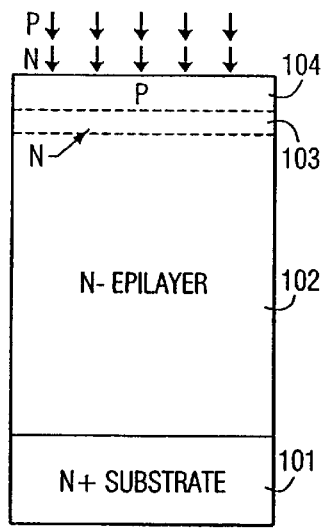
FIGS. 3A–3H depict the steps in the formation of device 300, a third embodiment of the present invention.
Figure 3B:
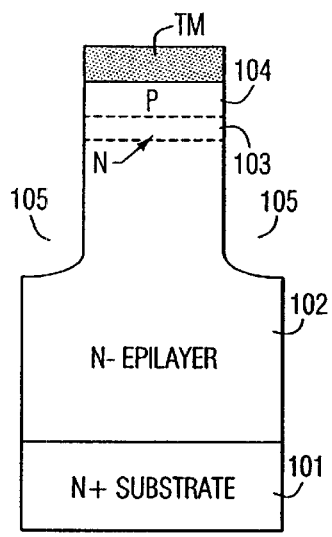
Figure 3C:
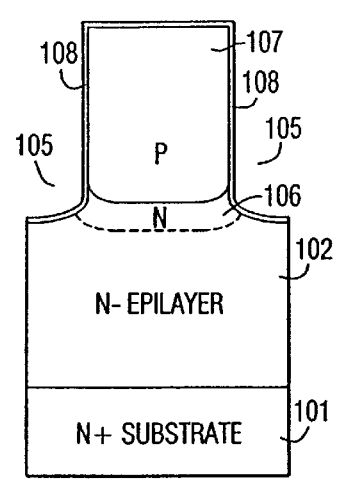
Figure 3D:
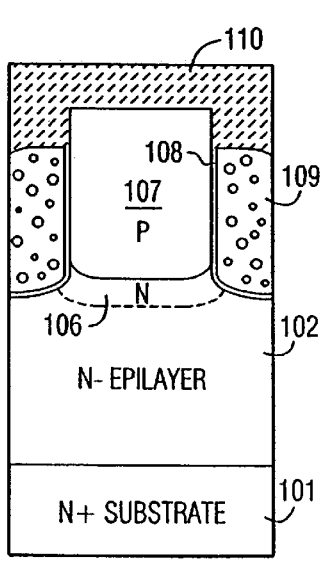
Figure 3E:
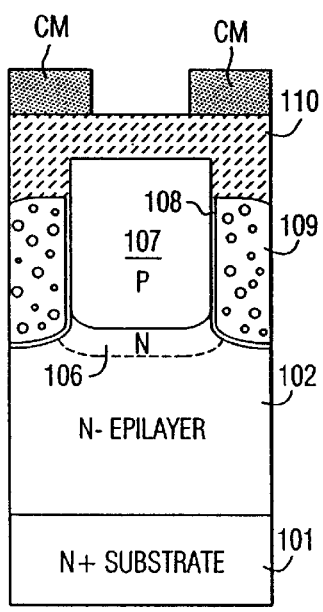
Figure 3F:
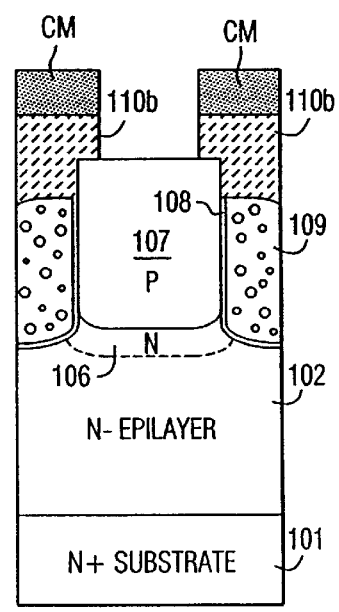

FIGS. 3A–3H schematically depict the formation of low voltage MOS device 300, a third embodiment of the present invention. The steps shown in FIGS. 3A–3D are the same as those of FIGS. 1A–1D for the formation of device 100. Then, as depicted in FIG. 3E, a contact mask CM is formed on the portions of insulating layer 110 overlying the trench gate regions, and the exposed portion of layer 110 is removed by etching, leaving portions 110b that overlie the gate regions and overlap P-well 107, as shown in FIG. 3F.

Figure 3G:
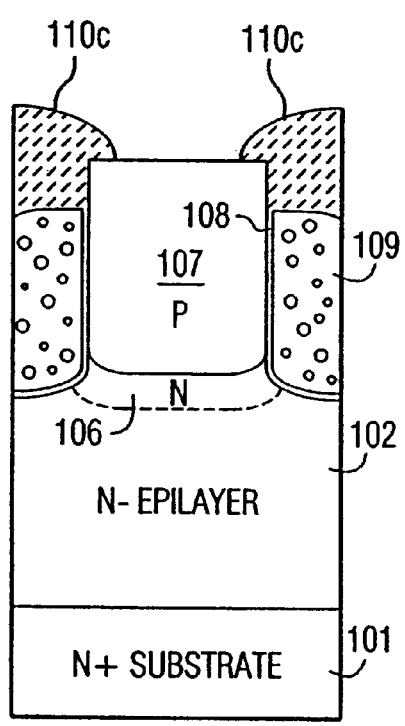
Figure 3H:
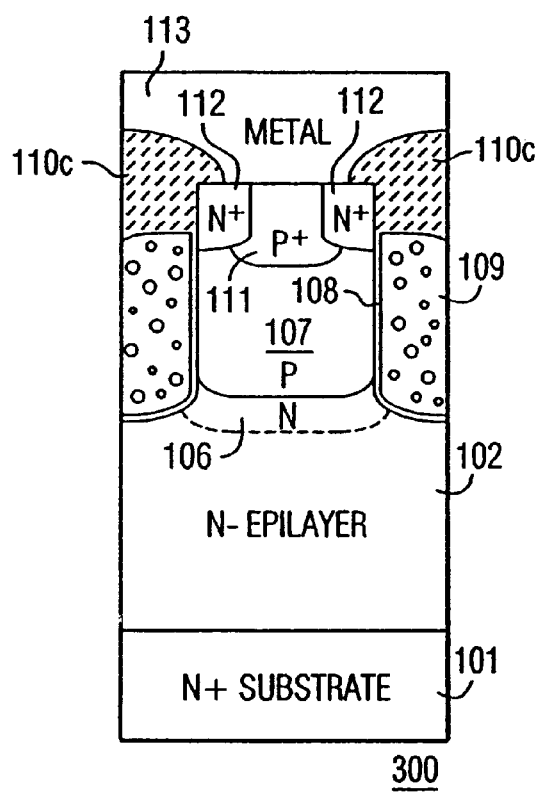

Following removal of contact mask CM, the sharp corners of insulating layer portions 110b removed by reflow, effected by heating at about 875° C., thereby forming a smoothed insulating layer 110c, which overlies the trench gate and a portion of P-well 107, as shown in FIG. 3G. Heavily doped P+ body and N+ source regions 111 and 112, respectively, are formed in P-well 107, and metal layer 113 is deposited to complete the formation of MOS device 300, depicted in FIG. 3H.

FIGS. 4A–4H schematically illustrate the formation of low voltage MOS device 400, a fourth embodiment of the present invention. The steps shown in FIGS. 4A–4D are the same as those of FIGS. 2A–2D for the formation of device 200, including the implantation of an N25 type dopant through the floor of trenches 105 to form a heavily doped JFET region 201 that merges with N-well 106 and the formation of a trench gate comprising gate oxide lining 108 and recessed gate conductor 109.

As shown in FIG. 4E, and similarly to the process shown in FIG. 3E for device 300 a contact mask CM is formed on the portions of insulating layer 110 overlying the trench gate regions, and the exposed portion of layer 110 is removed by etching, leaving portions 110b that overlie the gate regions and overlap P-well 107. The remaining steps, depicted in FIGS. 4F–4H, correspond to those of FIGS. 3F–3H. As shown in FIG. 4H, MOS device 400 of the present invention includes both the JFET region 201 of device 200 and the insulating layer 110c overlying the trench gate and a portion of P-well 107, which is present in device 300.

The invention has been described in detail for the purpose of illustration, but it is understood that such detail is solely for that purpose, and variations can be made therein by those skilled in the art without departing from the spirit and scope of the invention, which is defined by the following claims.

What is claimed:

1. An improved low-voltage MOSFET device having high ruggedness, low on-resistance, and improved body diode reverse recovery characteristics, said device comprising:

a semiconductor substrate having opposite surfaces;

a trench gate extending from one surface of the substrate toward the other surface, said trench gate having walls separated by a floor with the walls meeting the floor at opposite corners of the trench, the walls and the floor lined with a dielectric material and the lined trench further comprising a conductive material to form a gate electrode, said gate operable to control the flow of majority carriers between source regions on one surface and a drain region on the other surface;

first and second wells of doped regions in the substrate, the first well underlying the second well and the second well extending to the surface;

the second well comprising a heavily doped source region of said first conduction type and a heavily doped body region of a second and opposite conduction type;

the first well extending vertically to the bottom of the trench and laterally beyond the corner of the trench to partially underlay the floor of the trench;

a highly doped drain region on the other surface of the device.

2. The MOS device of claim 1 further comprising an epitaxial layer on the substrate, said epitaxial layer including the wells and the trench.

3. The MOS device of claim 1 wherein said first conduction type is N and said second conduction type is P.

4. The MOS device of claim 1 wherein said first conduction type is P and said second conduction type is N.

5. The MOS device of claim 1 wherein said substrate comprises monocrystalline silicon and said dielectric layer comprises silicon dioxide.

6. The MOS device of claim 1 wherein said conductive material included in said gate comprises highly doped polysilicon.

7. The MOS device of claim 1 wherein said conductive material in said gate trench is recessed, having an upper surface that is lower than the surface of the substrate.

8. The MOS device of claim 1 further comprising a highly doped JFET region underlying said trench and merging with said first well region.

9. The MOS device of claim 1 further comprising an interlevel dielectric layer overlying said trench gate and a source metal contact.

10. The MOS device of claim 9 wherein said interlevel dielectric layer further overlies a portion of said source region.

11. An improved low-voltage MOS device having high ruggedness, low on-resistance, and improved body diode reverse recovery characteristics, said device comprising:

a semiconductor substrate having opposite surfaces;

a trench gate extending from one surface of the substrate toward the other surface, said trench gate having walls separated by a floor with the walls meeting the floor at opposite corners of the trench, the walls and the floor lined with a dielectric material and the lined trench further comprising a conductive material to form a gate electrode;

first and second wells of doped regions in the substrate, the first well underlying the second well and the second well extending to the surface;

the second well comprising a heavily doped source region of said first conduction type and a heavily doped body region of a second and opposite conduction type;

the first well extending vertically to the bottom of the trench and;

a third well comprising a first conduction type disposed beneath the floor of the trench and forming a JFET beneath the trench;

an interlevel dielectric layer overlying said trench gate; and a source metal contact.

12. The MOS device of claim 11 wherein said interlevel dielectric layer further overlies a portion of said source region.

13. The MOS device of claim 11 further comprising an epitaxial layer on the substrate, said epitaxial layer including the wells and the trench.

14. The MOS device of claim 11 wherein said first conduction type is N and said second conduction type is P.

15. The MOS device of claim 11 wherein said first conduction type is P and said second conduction type is N.

16. The MOS device of claim 11 wherein said substrate comprises monocrystalline silicon and said insulating layer comprises silicon dioxide.

17. The MOS device of claim 11 wherein said conductive material included in said gate comprises highly doped polysilicon.

18. The MOS device of claim 11 wherein said interlevel dielectric layer comprises borophosphosilicate glass (BPSG).

19. An improved low-voltage MOS device having high ruggedness, low on-resistance, and improved body diode reverse recovery characteristics, said device comprising:

a semiconductor substrate;

first and second well regions, the second well region extending to the surface of the substrate and the first well region of a first conduction type, lightly doped and second well region of a second conduction type, said first well region underlying said second well region;

said second well region further comprising a heavily doped source region of said first conduction type and a heavily doped body region of a second and opposite conduction type disposed at the surface of the substrate;

a trench gate disposed in said upper layer and comprising a conductive material separated from said upper layer by an insulating layer;

a third region of the first conduction type, more heavily doped than the first well region and disposed in the substrate and adjacent the floor of the trench.

20. The improved low-voltage MOS device of claim 19 wherein third region forms a JFET beneath the trench gate.

21. The improved low-voltage MOS device of claim 19 wherein the third region merges with the first well to form a continuous region of variable concentration having maximum concentration beneath the trench floor and minimum concentration between the trench walls.

22. The MOS device of claim 19 wherein said first conduction type is N and said second conduction type is P.

23. The MOS device of claim 19 wherein said substrate comprises monocrystalline silicon and said insulating layer comprises silicon dioxide.

24. The MOS device of claim 19 wherein said conductive material in said gate comprises highly doped polysilicon.

* * * * *